United States Patent
Takahashi et al.

(10) Patent No.: US 12,429,442 B2
(45) Date of Patent: Sep. 30, 2025

(54) SCANNING ELECTRON MICROSCOPE AND MAP DISPLAY METHOD FOR ABSORPTION EDGE STRUCTURE

(71) Applicant: JEOL Ltd., Tokyo (JP)

(72) Inventors: Hideyuki Takahashi, Tokyo (JP); Takaomi Yokoyama, Tokyo (JP)

(73) Assignee: JOEL Ltd., Tokyo (JP)

( * ) Notice: Subject to any disclaimer, the term of this patent is extended or adjusted under 35 U.S.C. 154(b) by 432 days.

(21) Appl. No.: 17/941,394

(22) Filed: Sep. 9, 2022

(65) Prior Publication Data

US 2024/0085357 A1 Mar. 14, 2024

(30) Foreign Application Priority Data

Sep. 10, 2021 (JP) ................................. 2021-147896

(51) Int. Cl.
*G01N 23/2252* (2018.01)
*G06T 11/00* (2006.01)
(Continued)

(52) U.S. Cl.
CPC .......... *G01N 23/2252* (2013.01); *G06T 11/00* (2013.01); *H01J 37/244* (2013.01);
(Continued)

(58) Field of Classification Search
CPC ......... G01N 23/2252; G01N 2223/079; G01N 2223/418; G01N 2223/507;
(Continued)

(56) References Cited

U.S. PATENT DOCUMENTS

| 5,065,020 A * | 11/1991 | Kanda | H01J 37/256 250/311 |
| 5,247,562 A * | 9/1993 | Steinbach | H05G 2/00 372/5 |

(Continued)

FOREIGN PATENT DOCUMENTS

| JP | H09264857 A | 10/1997 |
| JP | 2004151045 A | 5/2004 |

(Continued)

OTHER PUBLICATIONS

Office Action issued in JP2021147896 on Nov. 7, 2023.
(Continued)

*Primary Examiner* — David A Vanore
(74) *Attorney, Agent, or Firm* — The Webb Law Firm

(57) ABSTRACT

An electron beam accelerated using a first acceleration voltage is applied to respective positions on a sample to obtain spectra A at the respective positions, and an electron beam accelerated using a second acceleration voltage different from the first acceleration voltage is applied to the respective positions on the sample to obtain spectra B at the respective positions. Then, a spectral ratio A/B of the spectra is calculated at each of the positions to generate a waveform representing the spectral ratio A/B. The value of a spectral ratio A/B in an energy region of interest is extracted from each of the waveforms. The extracted values are mapped onto points corresponding to the respective positions on the sample, whereby a spectral map is generated. The spectral map is displayed.

5 Claims, 18 Drawing Sheets

(51) Int. Cl.
*H01J 37/244* (2006.01)
*H01J 37/28* (2006.01)

(52) U.S. Cl.
CPC ........ *H01J 37/28* (2013.01); *G01N 2223/079* (2013.01); *G01N 2223/418* (2013.01); *G01N 2223/507* (2013.01); *H01J 2237/2445* (2013.01)

(58) Field of Classification Search
CPC ....... G01N 2223/206; G01N 2223/405; G01N 2223/408; G01N 2223/423; G06T 11/00; H01J 37/244; H01J 37/28; H01J 2237/2445; H01J 37/222
See application file for complete search history.

(56) References Cited

U.S. PATENT DOCUMENTS

| | | | | |
|---|---|---|---|---|
| 5,981,948 | A * | 11/1999 | Taniguchi | H01J 37/26 250/311 |
| 7,928,376 | B2 * | 4/2011 | Kaji | H01J 37/256 250/311 |
| 8,901,493 | B2 * | 12/2014 | Kaji | H01J 37/244 250/311 |
| 10,212,796 | B2 * | 2/2019 | Kaertner | H05G 2/008 |
| 2002/0015473 | A1 * | 2/2002 | Hertz | H01J 35/08 378/119 |
| 2004/0099805 | A1 * | 5/2004 | Ochiai | H01J 37/265 250/311 |
| 2005/0092929 | A1 * | 5/2005 | Schneiker | H01J 1/304 250/396 R |
| 2005/0139772 | A1 * | 6/2005 | Hasegawa | H01J 37/29 250/311 |
| 2005/0205775 | A1 * | 9/2005 | Bromberg | G01N 27/622 250/294 |
| 2007/0187591 | A1 * | 8/2007 | Bromberg | H01J 49/40 250/290 |
| 2009/0242766 | A1 * | 10/2009 | Terada | G01N 23/04 250/311 |
| 2015/0270094 | A1 * | 9/2015 | Ikku | G01N 23/2252 250/307 |
| 2016/0227639 | A1 * | 8/2016 | Kaminer | H05H 3/00 |
| 2018/0287329 | A1 * | 10/2018 | Yang | H01J 7/44 |
| 2019/0115184 | A1 * | 4/2019 | Zalubovsky | H01J 35/101 |
| 2023/0369004 | A1 * | 11/2023 | Kaminer | H01J 35/10 |

FOREIGN PATENT DOCUMENTS

| | | |
|---|---|---|
| JP | 6328456 B2 | 4/2018 |
| WO | WO-2009125603 A1 * | 10/2009 ............. H01J 37/22 |

OTHER PUBLICATIONS

Successful development of high energy resolution, soft X-ray spectrometer for electron microscope also capable of analyzing Li, Japan Science and Technology Agency, JEOL Ltd., Tohoku University, Shimadzu Corporation, Japan Atomic Energy Agency, Nov. 25, 2013, pp. 1-10.

Chemical State Map Analysis of Born in model B4C Control Rod under BWR Severe Accidental Condition by EPMA-SXES, Institute of Advanced Energy, Kyoto University, Ryuta Kasada, Ha Yoosung, Nippon Nuclear Fuel Development Co., Ltd., Hiroshi Sakamoto, Toru Higuchi, Dec. 1, 2016, p. 576.

Extended European Search Report issued in EP22193636.2 on Jan. 31, 2023.

Müller and Meen, Cu L-Spectra of YBCO, Bi-2212, and Related Cuprates, IEEE Transactions on Applied Superconductivity, vol. 19, No. 3, Jun. 2009, pp. 3549-3552.

Office Action issued in JP2020049573 on Feb. 6, 2024.

* cited by examiner

SCANNING ELECTRON MICROSCOPE AND MAP DISPLAY METHOD FOR ABSORPTION EDGE STRUCTURE

CROSS REFERENCE TO RELATED APPLICATION

This application claims priority to Japanese Patent Application No. 2021-147896, filed Sep. 10, 2021, the disclosure of which is hereby incorporated by reference in its entirety.

BACKGROUND OF THE DISCLOSURE

Field of the Disclosure

The present disclosure relates to a scanning electron microscope, in particular, to a technique for visualizing two dimensional spatial distribution of an absorption edge structure of a sample.

Description of Related Art

Methods have been known for analyzing elements of a sample by directing electrons, X-ray radiation, or the like to the sample and detecting electromagnetic waves generated from the sample.

One example of such a method is a method of applying an electron beam or an electrically-charged particle beam to a sample in an electron microscope to cause discharge of a characteristic X-ray from the sample. This method is used for analyzing elements, utilizing the fact that a characteristic X-ray has an energy unique to an element constituting a sample. The intensity spectrum of a characteristic X-ray indicates the number of times at which an X-ray is detected for each energy. An element in the sample can be identified based on the energy of a peak in the intensity spectrum, and the amount of that element contained in the sample can be determined based on the area of the peak in the intensity spectrum. With wavelength dispersive X-ray spectroscopy, a characteristic X-ray is dispersed through a diffraction grating, to thereby generate an intensity spectrum, and there is available a technique for collectively detecting spatially spreading characteristic X-rays outputted from the diffraction grating using a CCD camera.

JP2004-151045A discloses a device for calculating a ratio of intensity spectra respectively obtained using two different acceleration voltages, and then comparing the ratio with information registered in a database, to thereby identify an element in a scanning electron microscope.

JP6328456 discloses a device for determining the state of distribution of elements in the depth direction of a sample, based on an X-ray map obtained using two different acceleration voltages, in a scanning electron microscope.

Here, there has been known a method for analyzing the state of chemical bonding of a sample, using TEM-EELS, or a combination of a Transmission Electron Microscope (TEM) and Electron Energy Loss Spectroscopy (EELS). For example, by observing a Near Edge X-ray Absorption Fine Structure (ELNES), which appears in a TEM-EELS spectrum, the state of chemical bonding is analyzed. According to such a method using a TEM, however, a sample must be made thin, and thus cannot be used to conduct a wide-range observation of bulk samples.

Another method available is a method for observing a Near Edge X-ray Absorption Fine Structure based on an X-ray absorption spectrum (XAFS), which is measured using synchrotron radiation. This method, however, requires a large device, and cannot readily conduct a wide-range observation of a sample.

SUMMARY OF THE DISCLOSURE

An object of the present disclosure is to conduct a wide-range observation of a two-dimensional spatial distribution of an absorption edge structure of a sample using a scanning electron microscope.

According to one aspect of the present disclosure, there is provided a scanning electron microscope including an obtaining unit configured to apply individual electron beams to an area on a sample which uses two different acceleration voltages to obtain an electron beam excitation characteristic X-ray spectrum (hereinafter referred to as an emission spectrum) in the same soft X-ray area on the sample for each of the acceleration voltages; a calculation unit configured to calculate a spectral ratio between the emission spectra obtained through application of the electron beams with the two different acceleration voltages; and a display processing unit configured to extract a ratio in an energy region of interest corresponding to energy at an absorption edge of each element from the calculated spectral ratio, and display the extracted ratio as a spectral map on a display unit.

In one embodiment, the above-described scanning electron microscope may further include a storage unit configured to store an energy value at an X-ray absorption edge of an element, and, when the energy band of the calculated spectral ratio contains an energy value stored in the storage unit, the display processor may determine the energy value as the energy region of interest, then extract a ratio at the energy value as a ratio in the energy region of interest, and display the extracted ratio as the spectral map on the display unit.

In another embodiment, the calculation unit may calculate a spectral ratio between the emission spectra, while changing the energy band, depending on the element.

In another embodiment, the display processing unit may further display a graph generated by plotting the calculated spectral ratio for each energy on the display unit.

According to another aspect of the present disclosure, there is provided a map display method for displaying a map of an absorption edge structure, including the steps of applying individual electron beams to an area on a sample using two different acceleration voltages, to obtain an emission spectrum of a soft X-ray in the area on the sample for each of the acceleration voltages; calculating a spectral ratio between the emission spectra obtained through application of the electron beams with the two different acceleration voltages; extracting a ratio in an energy region of interest corresponding to energy at an absorption edge of each element from the calculated spectral ratio; and displaying the extracted ratio as a spectral map.

According to the present disclosure, it is possible to conduct wide-range observation of a two dimensional spatial distribution of an absorption edge structure of a sample, using a scanning electron microscope.

BRIEF DESCRIPTION OF THE DRAWINGS

Embodiments of the present disclosure will be described based on the following figures, wherein.

DESCRIPTION

Figure 1:
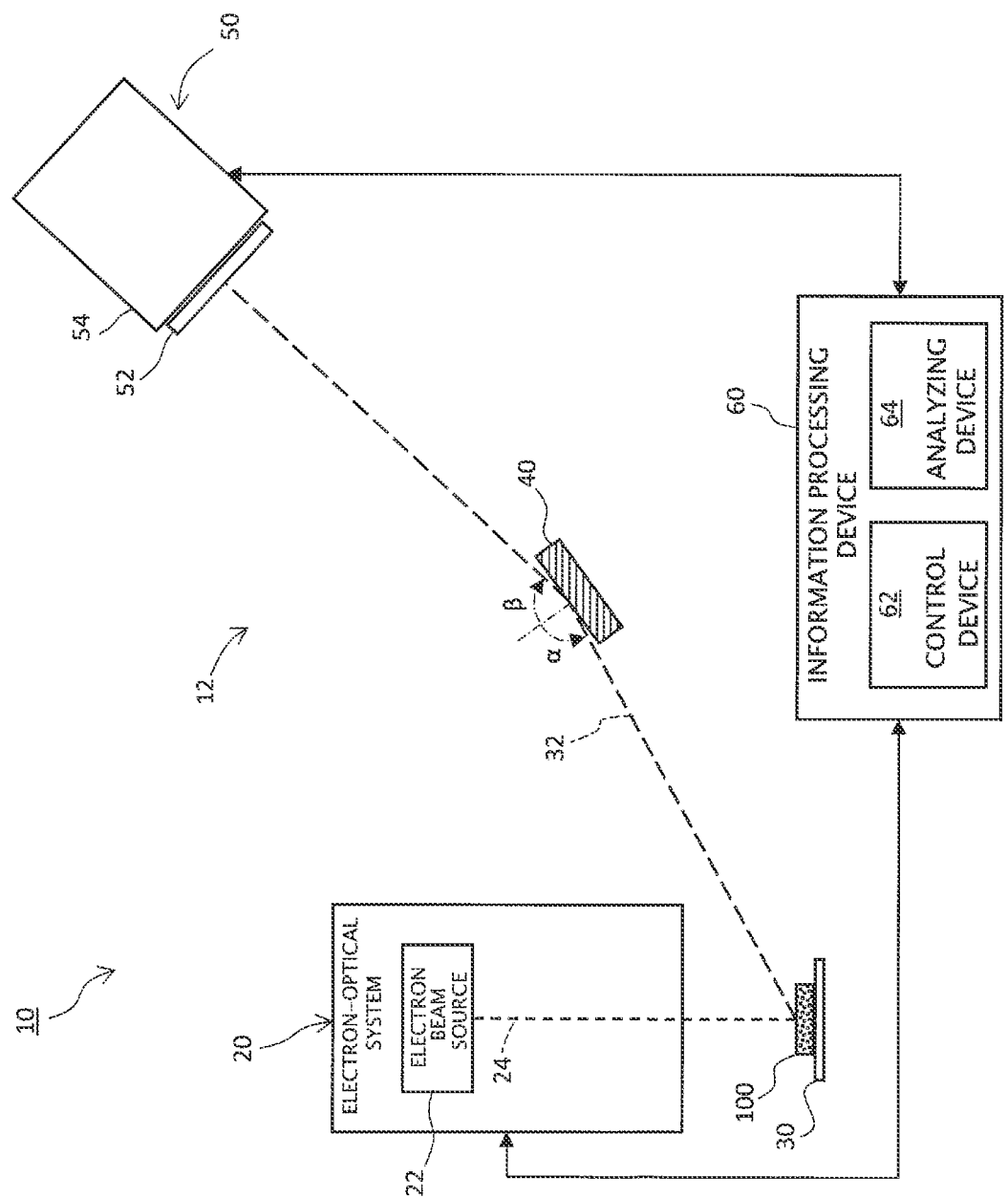
FIG. 1 illustrates a scanning electron microscope according to an embodiment.

A scanning electron microscope 10 according to an embodiment of the present disclosure will be described referring to FIG. 1. FIG. 1 illustrates a scanning electron microscope 10 according to an embodiment.

The scanning electron microscope 10 includes a wavelength dispersive X-ray spectrometer 12, an electron-optical system 20, a sample stage 30, and an information processing device 60. The wavelength dispersive X-ray spectrometer 12 includes an X-ray condensing mirror, not illustrated, a diffraction grating 40 having slits with inconsistent intervals, and a detection device 50.

The electron-optical system 20 is a system for generating an electron probe. Specifically, the electron-optical system 20 includes an electron beam source 22, such as an electron gun, for generating an electron beam 24. The electron beam source 22 generates electrons having energy having been set, while changing an acceleration voltage for accelerating electrons. The electron-optical system 20 further includes a slit, a condenser lens, a scanning coil, and an object lens, or the like, not illustrated. The electron-optical system 20 condenses and scans the electron beam 24.

The sample stage 30 is a component upon which a sample 100 is placed. With an electron beam 24 is directed at the sample 100, the sample 100 generates a characteristic X-ray 32. The characteristic X-ray 32 is an X-ray that is generated when an electron on an outer shell orbit (a shallower orbit) falls into an inner shell orbit (a deeper orbit) of an atom constituting the sample 100 when an electron on the inner orbit is bombard with an electron beam 24 and ejected from the inner shell orbit. In particular, a soft X-ray is a signal that is useful in analysis of a composition, bonding state, crystalline structure, or the like, of a sample. The characteristic X-ray 32 discharged from the sample 100 is condensed through an X-ray condensing mirror, not illustrated, before proceeding toward the diffraction grating 40. In this embodiment, a soft X-ray is detected as a characteristic X-ray 32. A soft X-ray is an X-ray having an energy of, for example, 1 keV or less, 500 eV or less, or 100 eV or less.

The diffraction grating 40 is an optical device (or a dispersive device) for dispersing a characteristic X-ray 32 for specific wavelengths. That is, an emission angle β relative to an incident angle α has a wavelength-dependency because of a diffraction phenomenon, and each characteristic X-ray component thus ejects at an angle in accordance with the wavelength. In this manner, the incident characteristic X-ray 32 is split into components for each wavelength, that is, components for each energy.

The detection device 50 includes a CCD detector 52 and a CCD controller 54. The CCD detector 52 has a two dimensional photo detector array for receiving an X-ray and converting the received X-ray into an electrical signal. Using the two dimensionally disposed photo detectors, the CCD detector 52 can simultaneously or collectively detect characteristic X-rays in a predetermined wavelength range (that is, a predetermined energy range). For example, the CCD detector 52 has a first axis corresponding to a wavelength dispersion direction and a second axis orthogonal to the wavelength dispersion direction. For every wavelength, a plurality of detection signals are accumulated parallel to the second axis. The CCD controller 54 controls the operation of the CCD detector 52, and counts an electric signal outputted from the CCD detector 52 for each photo detector. The number of electric signals counted during a set period of time (for example, one second, five seconds, ten seconds, or the like) is obtained for each wavelength. In this manner, an emission spectrum of a characteristic X-ray 32 is obtained.

The information processing device 60 comprises hardware or software. The hardware may include a Central Processing Unit (CPU), a memory, or the like, while the software may include an operating system (OS), an application program, or the like. The information processing device 60 may include a personal computer (PC). The information processing device 60 may include a single device or a plurality of devices.

The information processing device 60 includes a control device 62 and an analyzing device 64. The control device 62 controls the electron-optical system 20 and the detection device 50. The analyzing device 64 processes and analyzes a plurality of emission spectra (precisely, a plurality of emission spectral data) time-serially outputted from the CCD controller 54.

In a measurement process, a characteristic X-ray 32 output from the sample 100 is continuously detected while an electron beam 24 is continuously applied to the sample 100 to thereby generate an emission spectrum.

The scanning electron microscope 10 can measure emission spectra of a plurality of different characteristic X-rays 32 having extremely low energy. For example, for a sample 100 made of transition metal compounds, it is possible to simultaneously measure the emission spectra of an Lα line and of an Lβ line, which reflects the distribution of outer shell electrons, and the emission spectra of an L1 line and of an Lnx line, which reflects the distribution of slightly inner shell electrons. It is also possible to measure an energy position. With the above, it is possible to accurately measure chemical bonding information.

Figure 2:
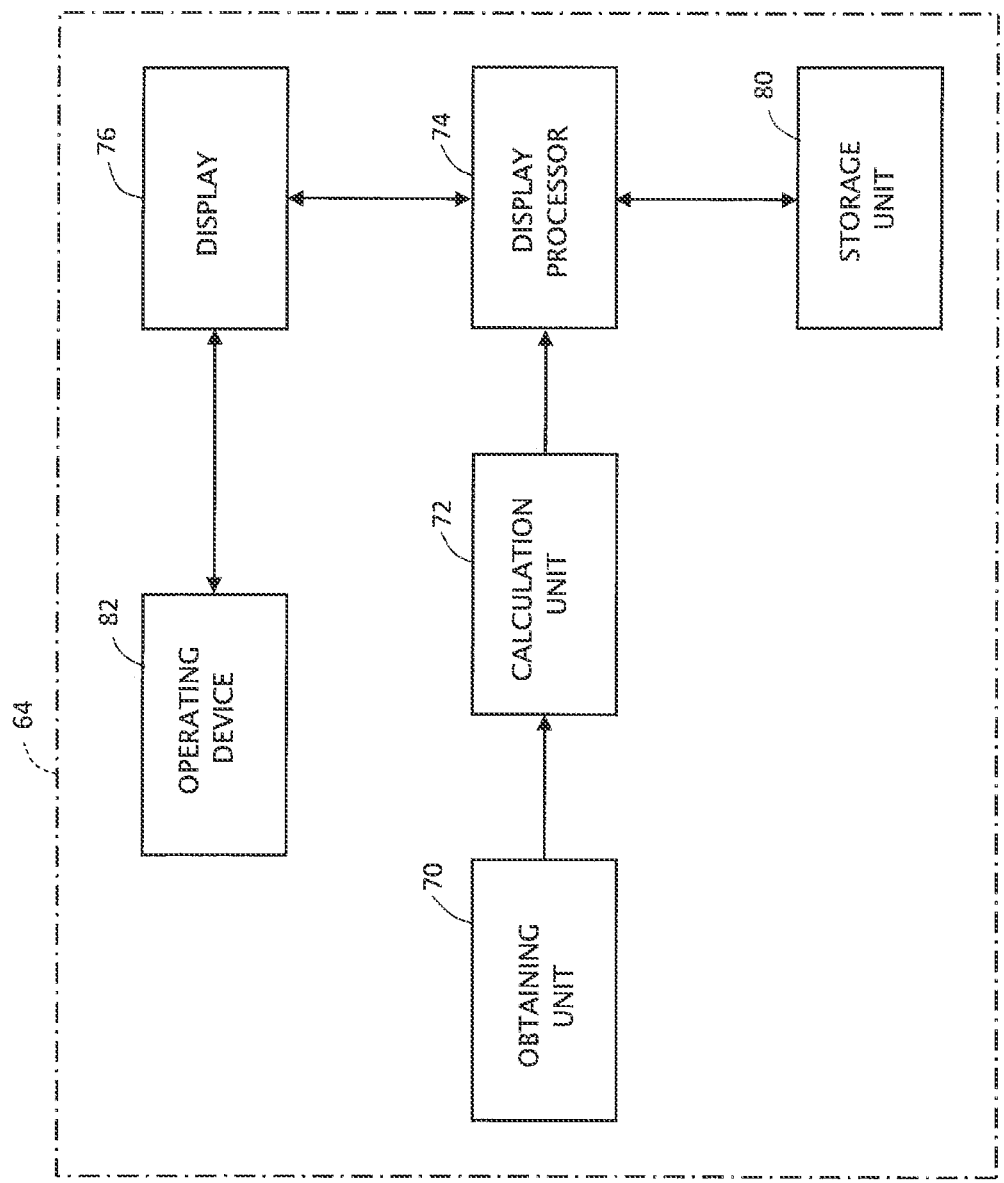
FIG. 2 is a block diagram illustrating an analyzing device.

Referring to FIG. 2, the analyzing device 64 will now be described. FIG. 2 is a block diagram illustrating the analyzing device 64.

The analyzing device 64 comprises an obtaining unit 70, a calculation unit 72, a display processor 74, a display 76, an operating device 82, and a storage unit 80.

The obtaining unit 70 obtains an emission spectrum output from the CCD controller 54, and then generates a waveform (for example, a line graph) representing each emission spectrum. The waveform is a waveform representing an intensity array constituting the emission spectrum. In a waveform representing an emission spectrum, the abscissa represents the energy, and the ordinate represents the intensity.

The obtaining unit 70 applies electron beams 24 to the same area on the sample 100, using two respectively different acceleration voltages, to obtain emission spectra of soft X-rays in the same area on the sample 100.

Specifically, under control by the control device 62 the electron beam source 22 accelerates electrons at a first acceleration voltage, to thereby generate an electron beam 24. The electron beam 24 accelerated using the first acceleration voltage is directed to the sample 100. The sample 100 generates a characteristic X-ray 32, which is detected by the detection device 50. With the above, an emission spectrum of electrons accelerated using the first acceleration voltage is obtained by the obtaining unit 70. An emission spectrum obtained with electrons accelerated using the first acceleration voltage will hereinafter be referred to as a "spectrum A".

Under control by the control device 62, the electron beam source 22 further accelerates electrons, using a second acceleration voltage different from the first acceleration voltage, to thereby generate an electron beam 24. The electron beam 24 accelerated using the second acceleration voltage is directed to the sample 100. The sample 100 generates a characteristic X-ray 32, which is detected by the detection device 50. With the above, an emission spectrum with electrons accelerated using the second acceleration voltage is obtained by the obtaining unit 70. An emission spectrum obtained with electrons accelerated using the second acceleration voltage will hereinafter be referred to as a "spectrum B".

The control device 62 executes control such that the respective electron beams 24 accelerated using the first acceleration voltage and using the second acceleration voltage are separately directed from the electron beam source 22 to the same position on the sample 100. With the above, a spectrum A and a spectrum B are separately obtained from the same position, so that the obtaining unit 70 obtains the spectrum A and the spectrum B at the same position.

Thereafter, while changing a position on the sample 100 to which the electron beam 24 is applied, the control device 62 executes control such that the respective electron beams 24 accelerated using the first acceleration voltage and using the second acceleration voltage are separately applied to the sample 100 from the electron beam source 22 at each used position. With the above, a spectrum A and a spectrum B are separately obtained for each position, so that the obtaining unit 70 obtains the spectra A and the spectra B in the respective positions.

Thereafter, the calculation unit 72 calculates a ratio of two emission spectra obtained using two respectively different acceleration voltages, the ratio of the intensities of two emission spectra. Such a ratio of two emission spectra will be hereinafter referred to as a "spectral ratio". To describe the processing of the calculation unit 72 in detail, the calculation unit 72 calculates a ratio of the spectrum A and the spectrum B obtained from the same position on the sample 100. The calculation unit 72 calculates a ratio of the spectrum A and the spectrum B at each of the positions to thereby obtain spectral ratios at the respective positions.

The calculation unit 72 generates a waveform (or a ratio spectrum) representing the spectral ratio (hereinafter referred to as a spectral ratio waveform) of a ratio calculated between the respective waveforms representing the spectrum A and the spectrum B. In this spectral ratio waveform, the abscissa represents the energy, while the ordinate represents the spectral ratio.

Thereafter, the display processor 74 generates a spectral map with spectral ratios mapped thereon, and displays the spectral map on the display 76. To describe this processing of the display processing 74 in detail, the display processor 74 extracts a spectral ratio in an energy region of interest (ROI) from a spectral ratio waveform at each of the positions on the sample 100, and maps the extracted spectral ratios onto points corresponding to the respective positions on the sample 100, whereby a spectral map showing spectral ratios at respective positions is generated. With the above, a spectral map in the energy ROI is generated. An energy ROI is an energy band corresponding to an absorption edge or near an absorption edge. The position and width of an energy ROI in the range of energy are determined in advance, for example, and may be changed, depending on an element constituting the sample 100 or by a user. The display processor 74 extracts a spectral ratio while changing the position of the energy ROI, and generates a spectral map for each energy ROI.

The storage unit 80 is a storage unit such as a hard disk drive, a memory, or the like. Energy values corresponding to the X-ray absorption edges of respective elements (that is, the position of an absorption edge in an energy band) are measured or calculated in advance and stored as a database in the storage unit 80. For example, as to metals, oxides, sulfides, compounds, semiconductors, and the like, the values of energy corresponding to the respective X-ray absorption edges are stored in the storage unit 80.

The operating device 82 includes a keyboard or a pointing device (for example, a mouse, a touch panel, a touch pad, or the like). A user operates the operating device 82 to input information to the information processing device 60.

Figure 3:
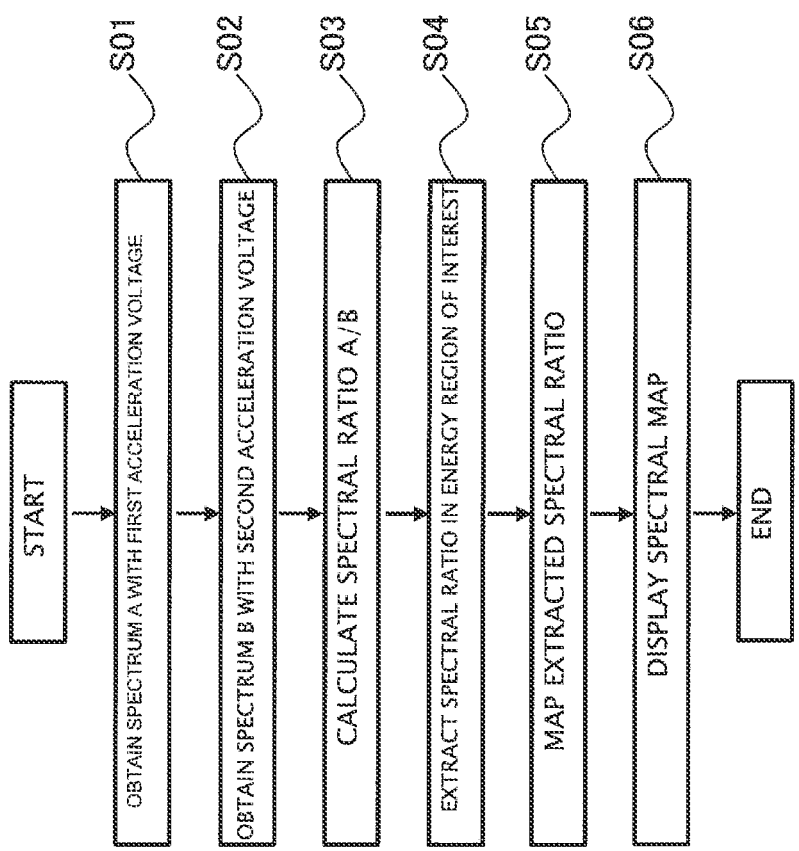
FIG. 3 is a flowchart of the operation of a scanning electron microscope.

Referring to FIG. 3, the operation of the scanning electron microscope 10 will now be described. FIG. 3 is a flowchart of the operation.

Initially, the control device 62 applies an electron beam 24 accelerated using the first acceleration voltage from the electron beam source 22 to each of the positions on the sample 100, and the obtaining unit 70 obtains a spectrum A at the position, the spectrum A being obtained through application of the electron beam 24 (S01). For example, in the case of a sample 100 made of transition metals, the first acceleration voltage is 1 to 3 kV, and a spectrum A of an L line is obtained. In the case of a sample 100 made of rare-earth elements, the first acceleration voltage is 1 to 3 kV, and a spectrum A of an M line is obtained.

Thereafter, the control device 62 applies the electron beam 24 accelerated using the second acceleration voltage from the electron beam source 22 to each of the positions on the sample 100, and the obtaining unit 70 obtains a spectrum B at the position, the spectrum B being obtained through application of the electron beam 24 (S02). The electron beam 24 accelerated using the second acceleration voltage is directed to the same position as where the electron beam 24 accelerated using the first acceleration voltage has been applied. For example, in the case of a sample 100 made of transition metals, the second acceleration voltage is 5 to 15 kV, and a spectrum B of an L line is obtained. In the case of a sample 100 made of rare-earth elements, the second acceleration voltage is 5 to 15 kV, and a spectrum B of an M line is obtained.

Thereafter, the calculation unit 72 calculates a ratio of the spectrum A and the spectrum B at each of the positions (S03). For example, the calculation unit 72 divides the intensity of the spectrum A at each of the positions by the intensity of the spectrum B, to thereby obtain a spectral ratio A/B at the position. With the above, waveforms representing the respective spectral ratios A/B (hereinafter referred to as a spectral ratio A/B waveform) at the respective positions are generated.

Thereafter, the display processor 74 extracts the value of a spectral ratio A/B in an energy ROI from the spectral ratio A/B waveform at each of the positions (S04). The display processor 74 then maps the extracted values of the respective spectral ratios A/B onto points corresponding to the respective positions on the sample 100, to thereby generate a spectral map showing the spectral ratios A/B at respective positions (S05). In this manner, the spectral map of the energy ROI is generated.

Further, having changed the position of the energy ROI, the display processor 74 extracts the value of a spectral ratio A/B in the energy ROI from the spectral ratio A/B waveform at each of the positions, and maps the extracted values of the respective spectral ratios A/B, whereby a spectral map in the energy ROI is generated. While changing the position of the energy ROI, the display processor 74 generates spectral maps of the respective energy ROIs.

The display processor 74 displays the spectral maps in the respective energy ROIs on the display 76 (S06).

In a case wherein the energy band of a spectral ratio A/B waveform contains any value of an energy corresponding to an absorption edge contained in the database stored in the storage unit 80, the display processor 74 may define that energy value as an energy ROI. In such a case, the display processor 74 may extract the value of the spectral ratio A/B at that energy value from the spectral ratio A/B waveform, and map the extracted value of the spectral ratio A/B, to thereby generate a spectral map.

An embodiment will now be described in detail by way of a specific example.

It is known that a higher acceleration voltage causes a larger change in waveform of an emission spectrum due to self-absorption of the sample 100. That is, a low acceleration voltage leads to little influence of absorption, while a high acceleration voltage leads to a large influence of absorption. Calculation of a ratio of an emission spectrum obtained with an electron beam 24 accelerated using a low acceleration voltage and applied to the sample 100 and an emission spectrum obtained with an electron beam 24 accelerated using a high acceleration voltage and applied to the sample 100 makes it possible to observe an absorption edge unique to a compound.

For example, as to an Fe simple substance, a larger acceleration voltage increases the value of $L\alpha/L\beta$. As to Fe2SiO4 (fayalite), on the other hand, a larger acceleration voltage decreases the value of $L\alpha/L\beta$.

Figure 4:
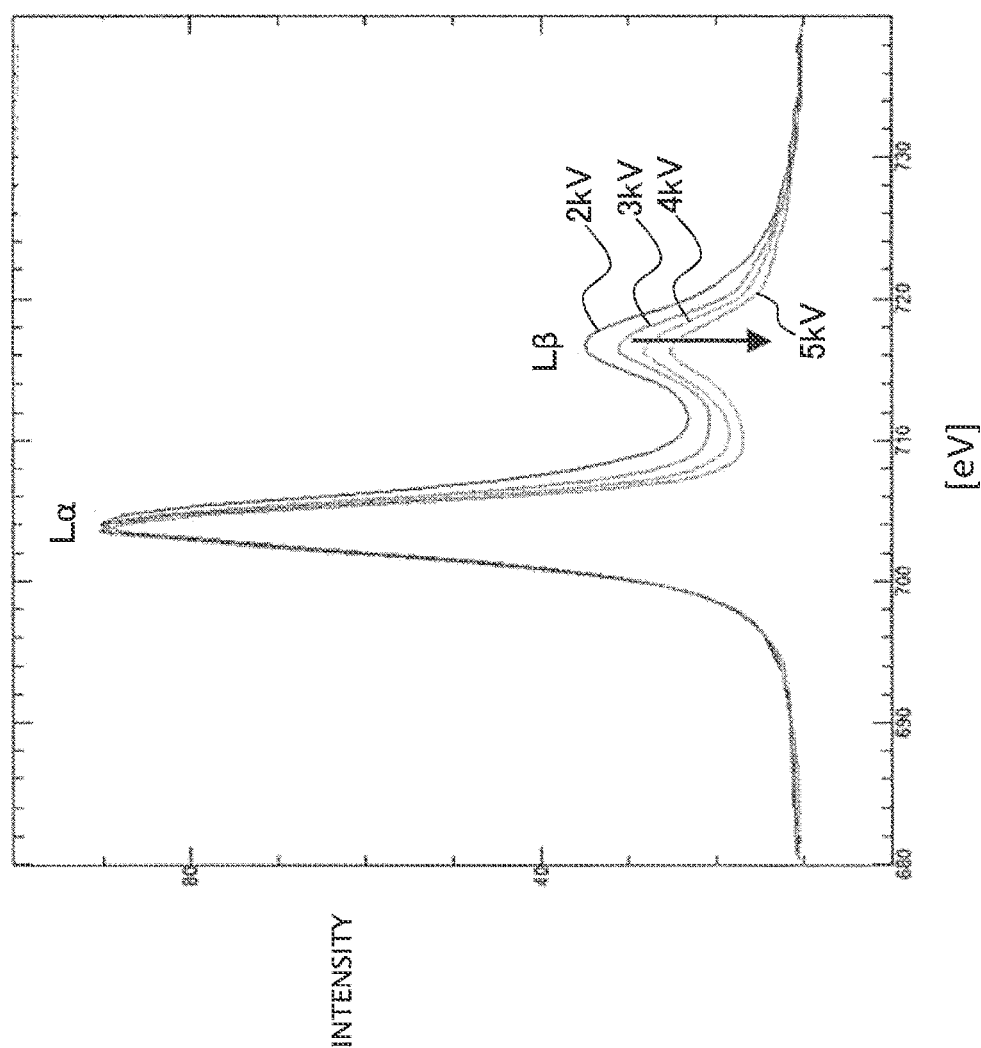
FIG. 4 illustrates an emission spectrum of an Fe simple substance.

FIG. 4 illustrates the intensity of an emission spectrum of an Fe simple substance, in which the abscissa represents the energy, and the ordinate represents the intensity.

Specifically, FIG. 4 illustrates respective emission spectra with respect to the acceleration voltages of 2, 3, 4, 5 kV. Although the intensity of the $L\alpha$ line is the same or substantially the same with respect to different acceleration voltages, the intensity of the $L\beta$ line becomes lower as the acceleration voltage becomes higher. This means that the ratio $L\alpha/L\beta$ in intensity between the $L\alpha$ line and the $L\beta$ line increases as the acceleration voltage increases.

Figure 5:
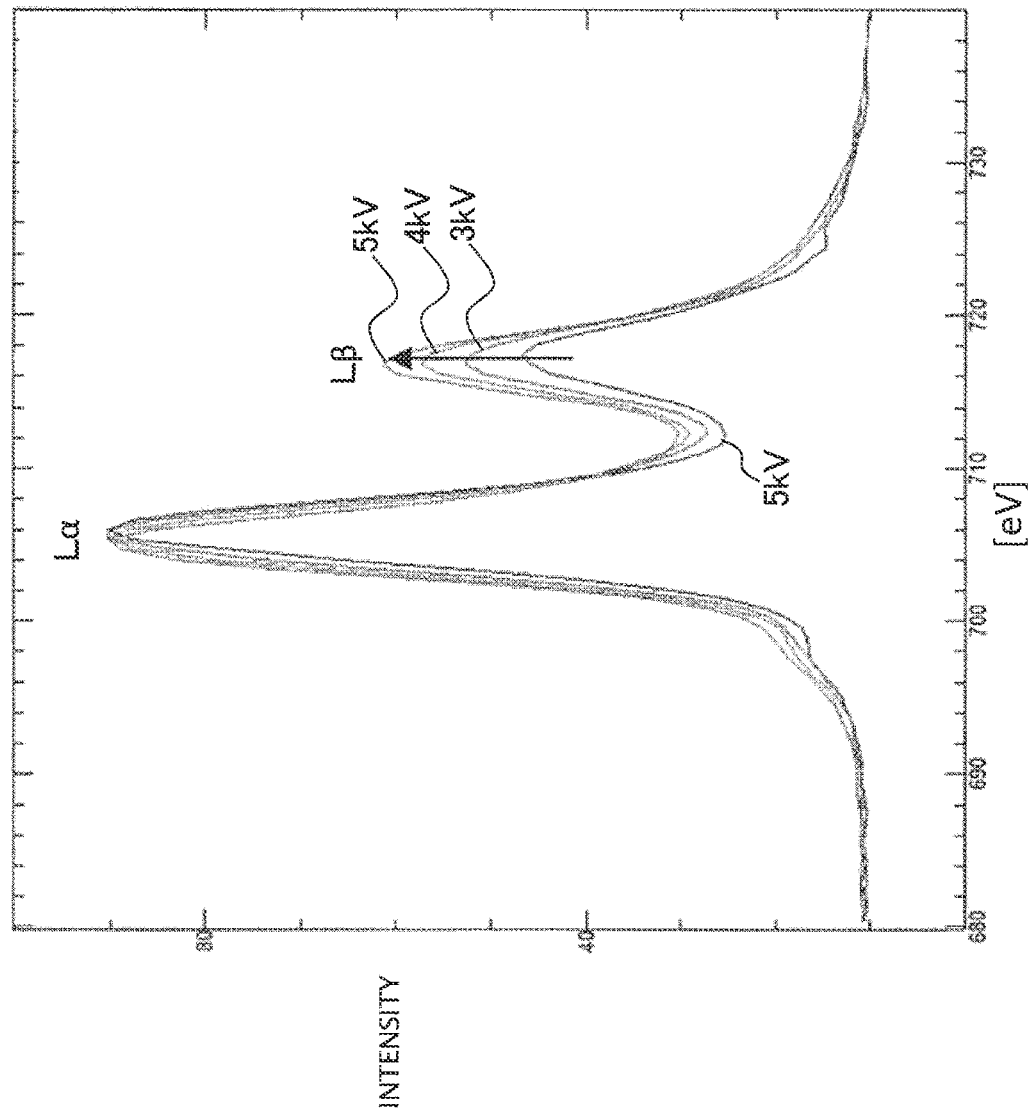
FIG. 5 illustrates an emission spectrum of Fe2SiO4.

FIG. 5 illustrates the intensity of an emission spectrum of Fe2SiO4, in which the abscissa represents the energy and the ordinate represents the intensity.

FIG. 5 illustrates respective emission spectra with respect to the acceleration voltage of 2, 3, 4, 5 kV. Although the intensity of the $L\alpha$ line is the same or substantially the same with respect to different acceleration voltages, the intensity of the $L\beta$ line becomes higher as the acceleration voltage becomes higher. This means that the ratio $L\alpha/L\beta$ in intensity between the $L\alpha$ line and the $L\beta$ line decreases as the acceleration voltage increases. This phenomenon is mainly attributed to an absorption effect and the fact that absorption edges L3, L2 are different depending on compounds.

Figure 6:
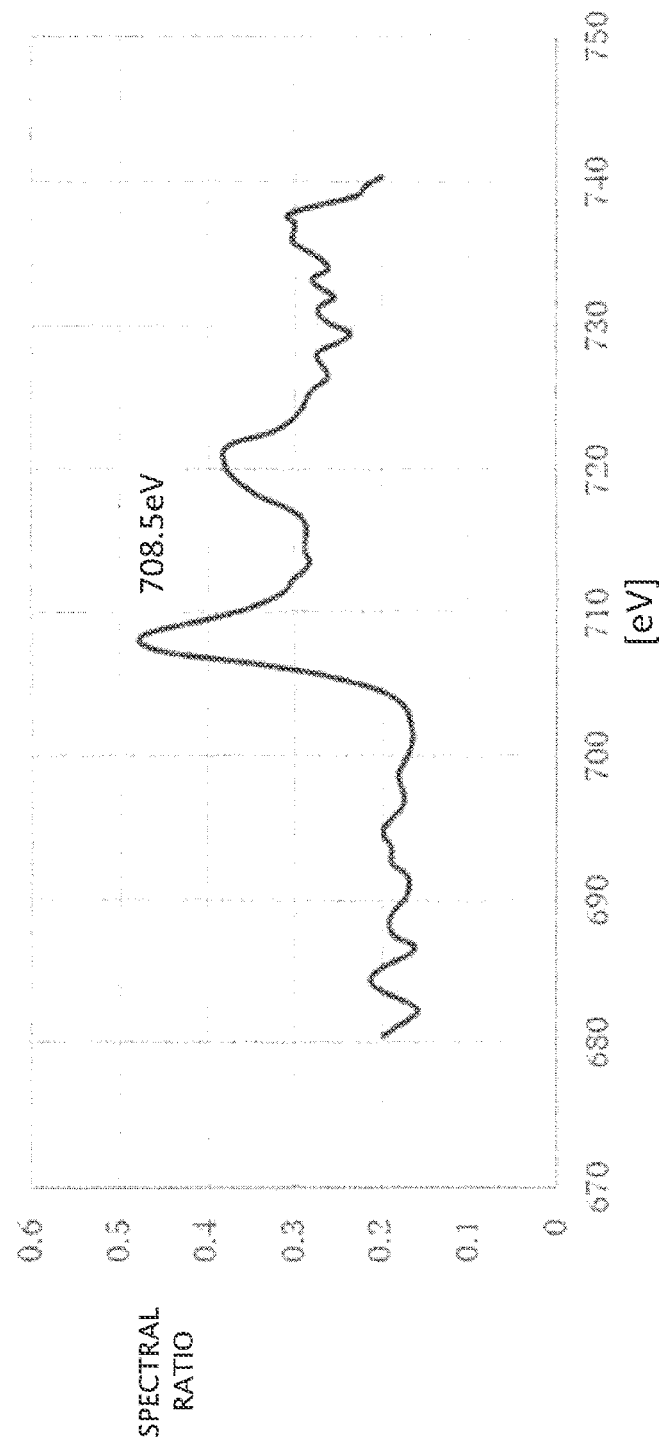
FIG. 6 illustrates a spectral ratio of an Fe simple substance.

FIG. 6 illustrates a spectral ratio waveform of an Fe simple substance, in which the abscissa represents the energy and the ordinate represents the spectral ratio. In one example here, the first acceleration voltage, or a low acceleration voltage, is 2 kV, and the second acceleration voltage, or a high acceleration voltage, is 5 kV. A spectrum A is obtained using the first acceleration voltage of 2 kV, and a spectrum B is obtained using the second acceleration voltage of 5 kV. A spectral ratio A/B, or a ratio in intensity between the spectrum A and the spectrum B, is calculated to generate a spectral ratio A/B waveform. The spectral ratio assigned to the ordinate corresponds to this spectral ratio A/B. FIG. 6 illustrates a spectral ratio A/B waveform in an energy band (from 680 to 740 eV) that contains the energy of the $L\alpha$ line.

A ratio spectrum reflecting the absorption edge L3 and being substantially equivalent to an absorption spectrum that will be obtained with synchrotron radiation is obtained. The energy corresponding to a peak of the spectral ratio A/B waveform is an energy reflecting the absorption edge L3, which is 708.5 eV, for example.

Figure 7:
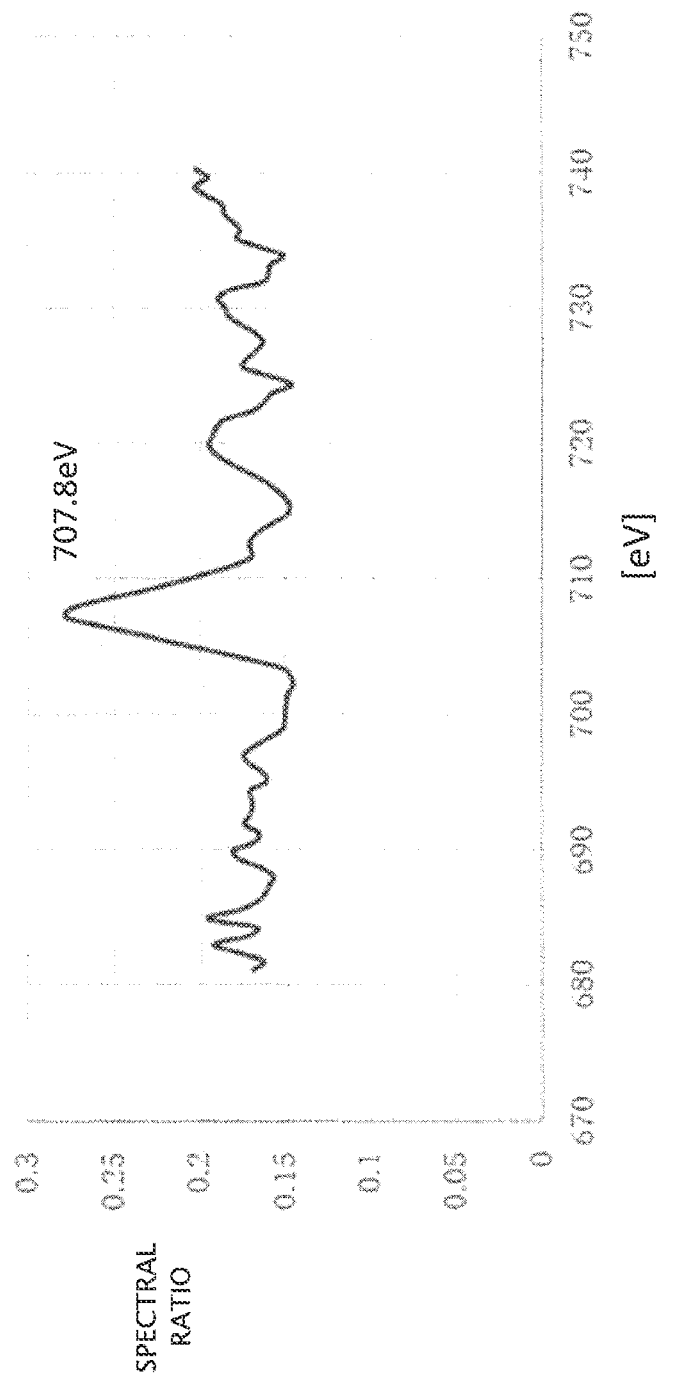
FIG. 7 illustrates a spectral ratio of Fe2SiO4.

FIG. 7 illustrates the spectral ratio waveform of Fe2SiO4 (fayalite), similar to that of an Fe simple substance. The energy value corresponding to a peak of the spectral ratio A/B waveform is 707.8 eV. That is, an energy reflecting the absorption edge L3 is 707.8 eV.

In an embodiment, spectral ratios are mapped, based on the above-described relationship, to thereby generate a spectral map. Generation of a spectral map will now be described.

Figure 8:
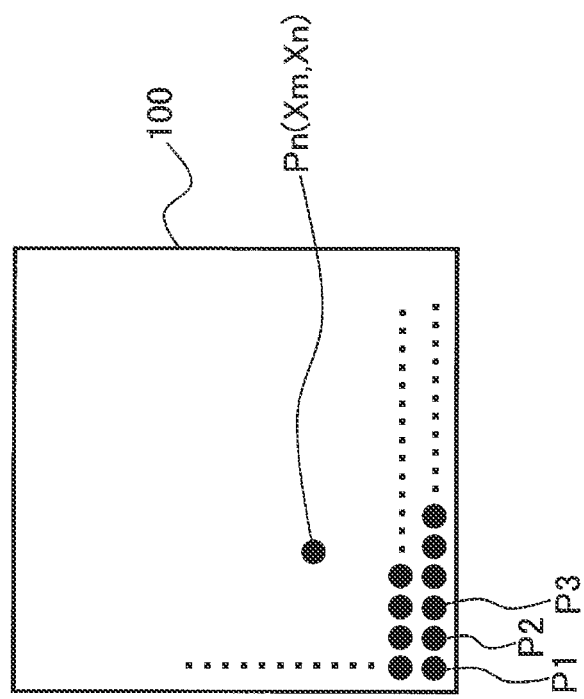
FIG. 8 illustrates a sample.

FIG. 8 illustrates a sample 100, viewed from the side of the electron-optical system 20, in which the X axis and the Y axis are orthogonal to each other, and together define a two dimensional (2D) plane. Each position on the surface of the sample 100 is defined with the X axis and the Y axis.

The control device 62 executes control such that an electron beam 24 accelerated using the first acceleration voltage is applied from the electron beam source 22 to respective positions (positions P1, P2, P3, . . . , Pn (Xm, Xn), . . . ) on the sample 100, so that the obtaining unit 70 obtains spectra A at those positions. That is, while changing a position to which the electron beam 24 is applied, the control device 62 applies the electron beam 24 to the surface of the sample 100, so that the obtaining unit 70 obtains spectra A at the respective positions.

Similarly, the control device 62 executes control such that an electron beam 24 accelerated using the second acceleration voltage is applied from the electron beam source 22 to respective positions (positions P1, P2, P3, . . . Pn (Xm, Xn), . . . ) on the sample 100, so that the obtaining unit 70 obtains spectra B at those positions. That is, while changing a position to which the electron beam 24 is applied, the control device 62 applies the electron beam 24 to the surface of the sample 100, so that the obtaining unit 70 obtains spectra B at the respective positions.

With the spectra A, B obtained at the respective positions, the calculation unit 72 calculates a spectral ratio A/B, or a ratio in intensity between the spectral A and the spectral B, at each of the positions.

Figure 9:
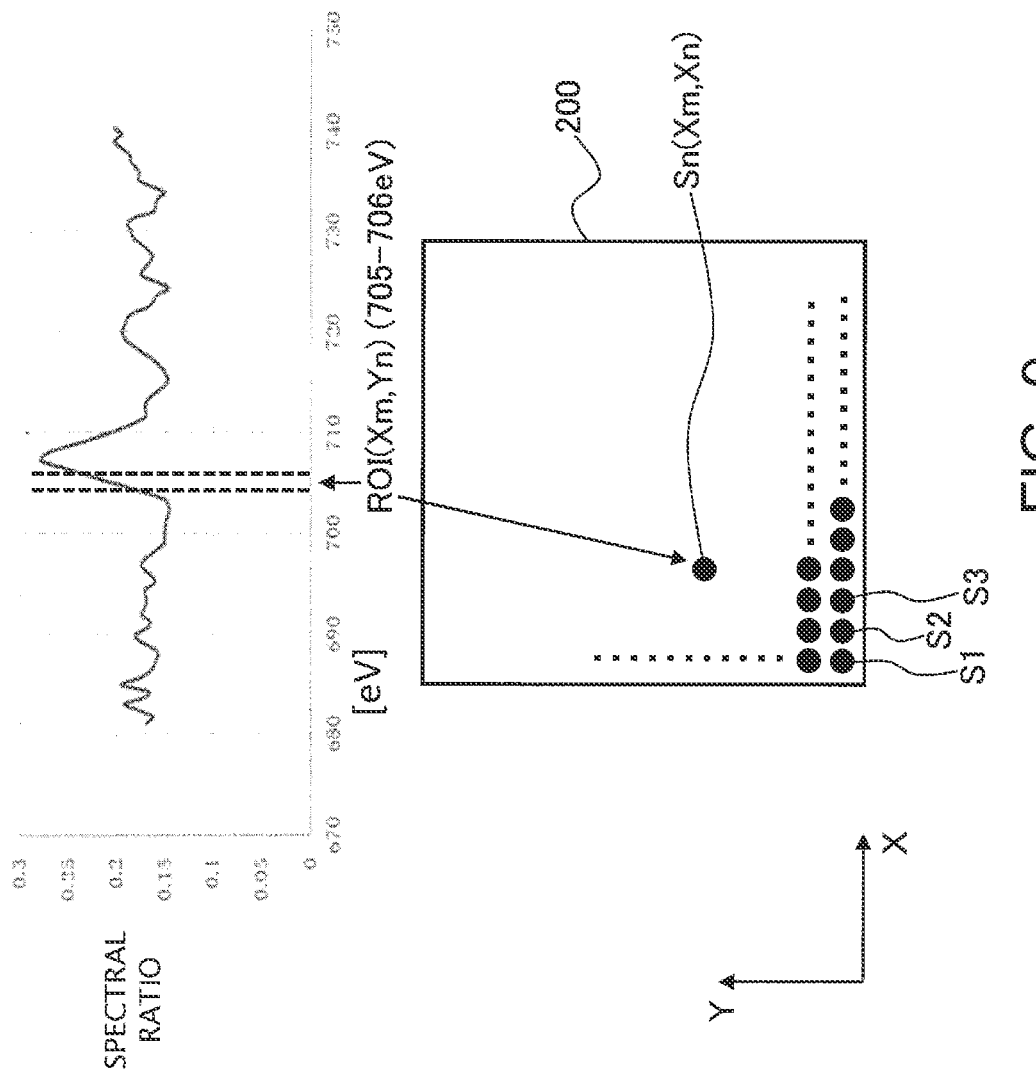
FIG. 9 is a diagram explaining generation of a spectral map showing spectral ratios.
Figure 10:
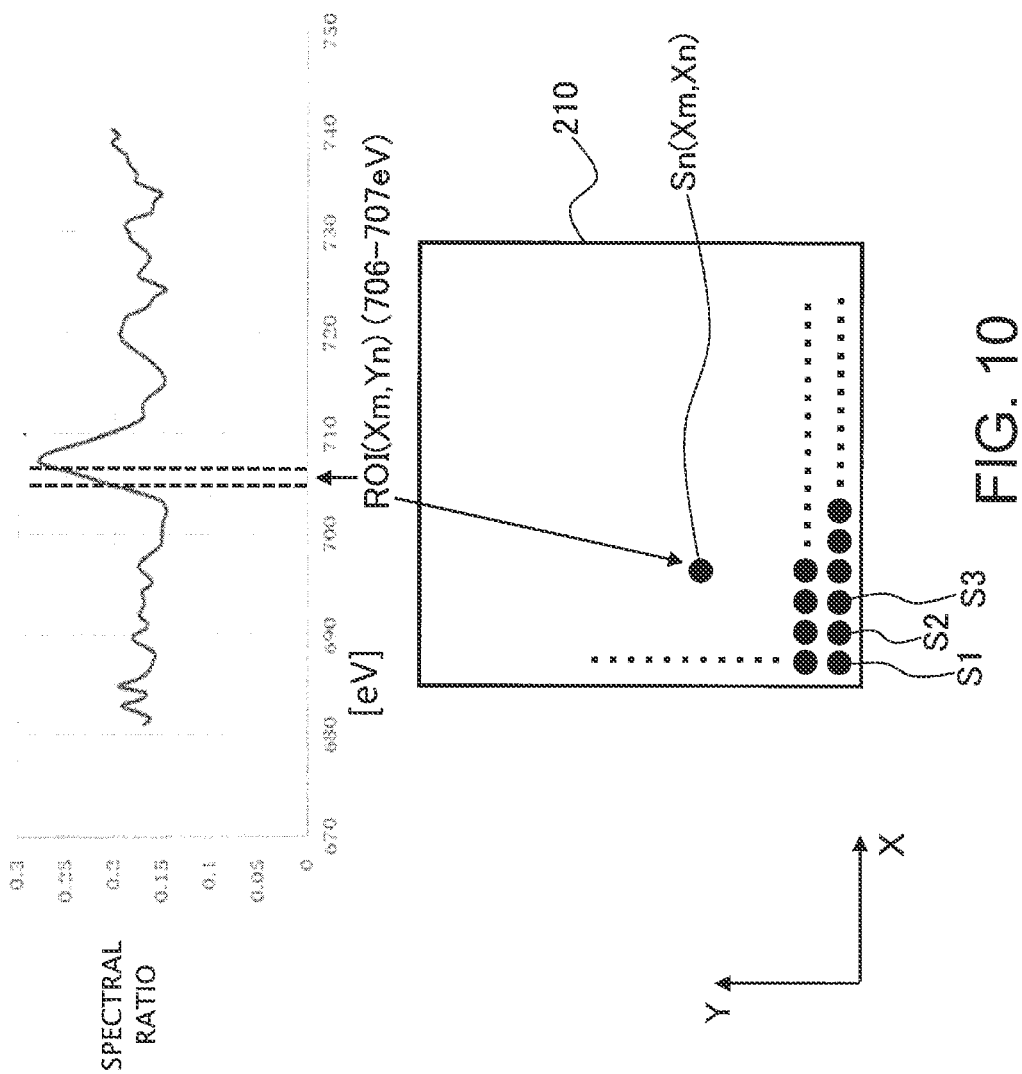
FIG. 10 is a diagram explaining generation of a spectral map showing spectral ratios.

Referring to FIG. 9 and FIG. 10, generation of a spectral map showing spectral ratios A/B will be described. FIG. 9 and FIG. 10 illustrate spectral ratios and spectral maps.

FIG. 9 and FIG. 10 illustrate spectral ratios A/B at a position Pn (Xm, Yn).

The display processor 74 extracts the value of a spectral ratio A/B in an energy ROI from the spectral ratio A/B waveform at the position Pn (Xm, Yn). In the example illustrated in FIG. 9, the energy ROI ranges from 705 to 706 eV, and the display processor 74 extracts the value of a spectral ratio A/B in the energy band from 705 to 706 eV from the spectral ratio A/B waveform. For example, the display processor 74 extracts the value of a spectral ratio A/B at the middle position of the energy band from 705 to 706 eV or the average of the spectral ratios A/B in the energy band from 705 to 706 eV as the value of a spectral ratio A/B in the energy band from 705 to 706 eV. The display processor 74 similarly extracts the value of a spectral ratio A/B in the energy ROI in the following processing. The display processor 74 then maps the extracted value Sn (Xm, Yn) of the spectral ratio A/B onto a point corresponding to the position Pn (Xm, Yn).

The display processor 74 extracts the values S1, S2, S3, . . . , Sn (Xm, Yn) . . . of the spectral ratios A/B in the energy band, or a ROI, ranging from 705 to 706 eV from the spectral ratio A/B waveforms at respective positions P1, P2, P3, . . . , Pn (Xm, Yn) . . . , and then maps the extracted values onto points corresponding to the respective positions on the sample 100. With the above, a spectral map showing the spectral ratios A/B in the energy band from 705 to 706 eV at the respective positions is generated.

The spectral map 200 illustrated in FIG. 9 is a spectral map in the ROI ranging from 705 to 706 eV.

The display processor 74 generates a spectral map while changing the position of the energy ROI. For example, the ROI in FIG. 10 ranges from 706 to 707 eV, and the spectral map 210 in FIG. 10 is a spectral map in the ROI ranging from 706 to 707 eV. That is, the display processor 74 extracts values S1, S2, S3, Sn (Xm, Yn) . . . of the spectral ratios A/B in the energy band ranging from 706 to 707 eV at respective positions, and map the extracted values onto points corresponding to the respective positions on the sample 100. With the above, the spectral map 210 is generated.

As described above, while changing the position of the energy ROI, the display processor 74 generates spectral maps in the respective energy ROIs.

It should be noted that, although the width of the energy ROI in the example illustrated in FIG. 9 and FIG. 10 is 1 eV, the display processor 74 may change the width of the energy ROI, depending on an element contained in the sample 100.

Figure 11:
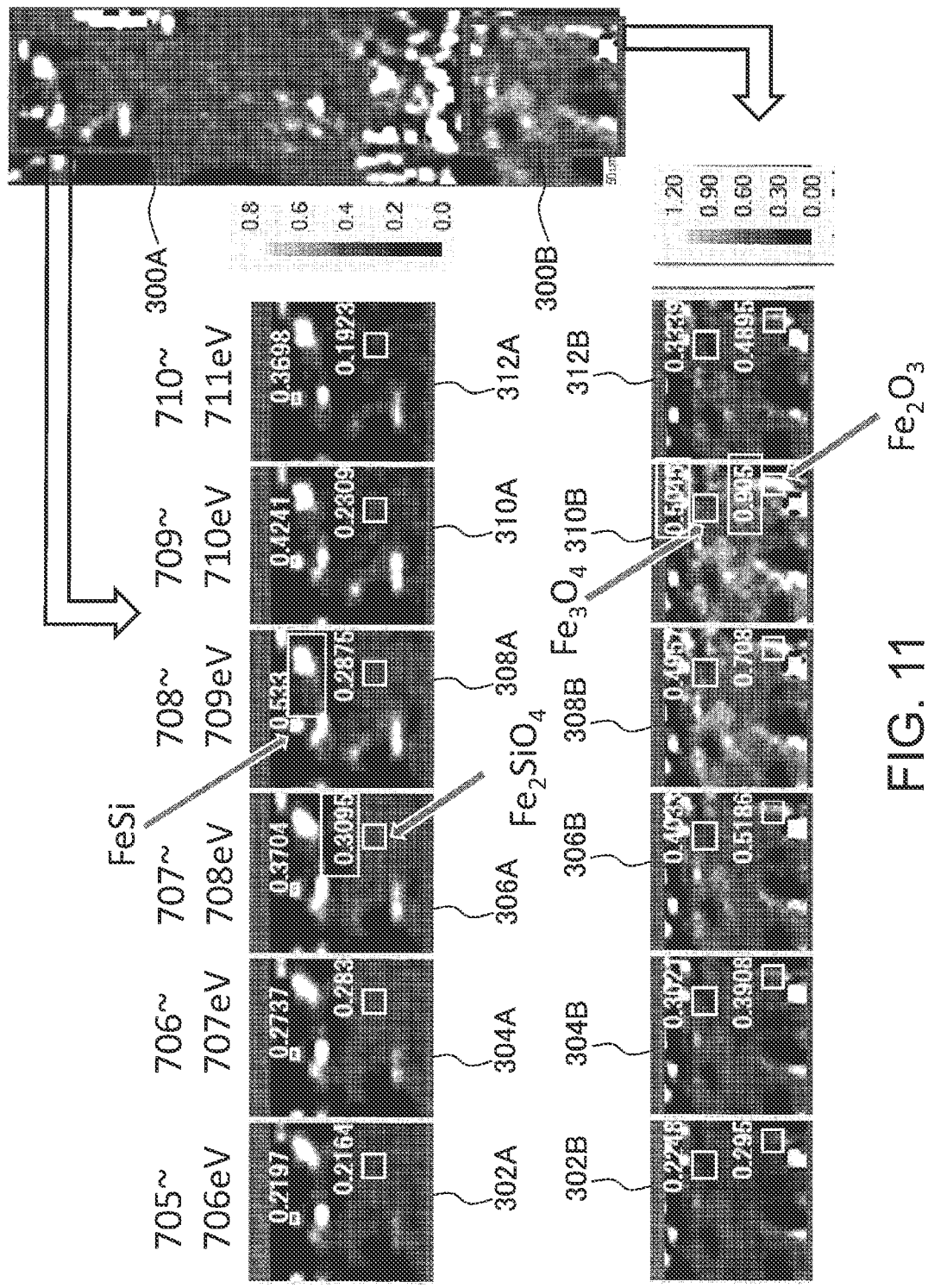
FIG. 11 illustrates specific examples of a spectral map.

A specific example will now be described. A compound containing a Fe·Si metal, Fe2SiO4, Fe3O4, and Fe2O3 is used as a sample 100. The first acceleration voltage is 2.5 kV, and the second acceleration voltage is 10 kV. That is, a spectrum A is obtained using the first acceleration voltage of 2.5 kV, a spectrum B is obtained using the second acceleration voltage of kV, and a spectral ratio A/B is then calculated. The range of energy is from 705 to 710 eV, and the width of an energy ROI is 1 eV. Under these conditions, a spectral map is generated. FIG. 11 illustrates spectral maps relevant to Fe·Si metal and Fe2SiO4, that are generated under these conditions.

The respective spectral maps illustrated in FIG. 11 are generated based on the ratio spectrum of Fe. Specifically, the calculation unit 72 calculates a spectral ratio A/B, that is, a ratio of the spectrum A of Fe, obtained using the first acceleration voltage of 2.5 kV, and a spectrum B of Fe, obtained using the second acceleration voltage of 10 kV. The display processor 74 extracts the value of a spectral ratio A/B for every energy ROI (1 eV) from a spectral ratio A/B waveform within the range from 705 to 710 eV, or an energy band of the Lα line and Lβ line of Fe, and maps the extracted values onto points corresponding to the respective positions on the sample 100, to thereby generate spectral maps.

FIG. 11 illustrates spectral maps at respective positions in areas 300A, 300B of the sample 100.

Specifically, the spectral map 302A shows spectral ratios A/B in the energy ROI from 705 to 706 eV at respective positions in the area 300A.

The spectral map 302B shows spectral ratios A/B in the energy ROI from 705 to 706 eV at respective positions in the area 300B.

The spectral map 304A shows spectral ratios A/B in the energy ROI from 706 to 707 eV at respective positions in the area 300A.

The spectral map 304B shows spectral ratios A/B in the energy ROI from 706 to 707 eV at respective positions in the area 300B.

The spectral map 306A shows spectral ratios A/B in the energy ROI from 707 to 708 eV at respective positions in the area 300A.

The spectral map 306B shows spectral ratios A/B in the energy ROI from 707 to 708 eV at respective positions in the area 300B.

The spectral map 308A shows spectral ratios A/B in the energy ROI from 708 to 709 eV at respective positions in the area 300A.

The spectral map 308B shows spectral ratios A/B in the energy ROI from 708 to 709 eV at respective positions in the area 300B.

The spectral map 310A shows spectral ratios A/B in the energy ROI from 709 to 710 eV at respective positions in the area 300A.

The spectral map 310B shows spectral ratios A/B in the energy ROI from 709 to 710 eV at respective positions in the area 300B.

The spectral map 312A shows spectral ratios A/B in the energy ROI from 710 to 711 eV at respective positions in the area 300A.

The spectral map 312B shows spectral ratios A/B in the energy ROI from 710 to 711 eV at respective positions in the area 300B.

The display processor 74 adds a color in accordance with the magnitude of the value of a spectral ratio A/B to a spectral map. For example, colors in the range from red to blue (for example, red, yellow, green, blue, and the like) in accordance with the magnitude of the respective values are added to a spectral map. Specifically, red corresponds to a large value, and blue corresponds to a small value. More specifically, a color in the range from red to blue in accordance with the magnitude of the value is added. That is, the larger the value of the spectral ratio A/B is, a color closer to red is added.

The display processor 74 displays the spectral maps 302A to 312A, 302B to 312B on the display 76.

An energy band in which a peak of the spectral ratio A/B is measured is an energy band that contains the value of an energy corresponding to an absorption edge. By referring to a spectral map with spectral ratios A/B mapped thereon, a user can recognize an energy band in which a spectral ratio A/B having a large value or a peak of the spectral ratio A/B is measured. According to this embodiment, it is possible to display an absorption edge, such as is obtained with synchrotron radiation, in the form of a spectral map.

When an energy band (for example, an energy band from 705 to 710 eV) in which a spectral ratio A/B is measured contains any energy value stored in the storage unit 80 (that is, an energy value registered in the database containing energy values corresponding to the absorption edges of respective elements), the display processor 74 may define the energy value as an energy ROI, and extract the value of a spectral ratio A/B at the energy value as the value of a spectral ratio A/B in the energy ROI. Then, the display processor 74 may map the extracted value of the spectral ratio A/B to thereby generate a spectral map, and display the spectral map on the display 76.

Referring to the database containing the values of energy corresponding to the absorption edges of respective elements, the display processor 74 may identify the components of the respective areas in the respective spectral maps 302A to 312A, 302B to 312B.

For example, there is a peak (0.533) of the spectral ratio A/B in the energy band from 708 to 709 eV. This energy band (708 to 709 eV) with this peak measured is an energy band that contains the value of energy corresponding to an Fe L absorption edge of an Fe·Si metal. A component having a peak of a spectral ratio A/B in the energy band from 708 to 709 eV is an Fe·Si metal. The database contains the energy band from 708 to 709 eV registered therein in advance as an energy band containing the value of energy corresponding to an Fe L absorption edge of Fe·Si. Referring to the database, the display processor 74 determines that an area with a peak of a spectral ratio A/B in the energy band from 708 to 709 e is an area composed of Fe·Si.

Further, there is a peak (0.3095) of the spectral ratio A/B waveform in the energy band from 707 to 708 eV. This energy band (707 to 708 eV) with this peak measured is an energy band that contains the value of energy corresponding to an Fe L absorption edge of Fe2SiO4. A component having a peak of a spectral ratio A/B in the energy band from 707 to 708 eV is Fe2SiO4. The database contains the energy band from 707 to 708 eV registered therein in advance as an energy band containing the value of energy corresponding to an Fe L absorption edge of Fe2SiO4. Referring to the database, the display processor 74 determines that an area with a peak of a spectral ratio A/B in the energy band from 707 to 708 eV is an area composed of Fe2SiO4.

Although Fe·Si and Fe2SiO4 have been described above as an example, this process is similarly applied to Fe2O3 and Fe3O4, and an area composed of Fe2O3 and an area composed of Fe3O4 are similarly identified. In the above-described manner, an area composed of Fe·Si metal components, an area composed of Fe2SiO4 components, an area composed of Fe2O3, and an area composed of Fe3O4 in the sample 100 are identified.

The display processor 74 may add colors which differ for each component to areas corresponding to respective components in a spectral map. The, the display processor 74 colors respective areas corresponding to Fe·Si metal components, Fe2SiO4 components, Fe2O3 components, and Fe3O4 components in a spectral map with a different color for each component. For example, the display processor 74 displays an area corresponding to Fe·Si metal components in red, an area corresponding to Fe2SiO4 components in blue, an area corresponding to Fe2O3 components in yellow, an area corresponding to Fe3O4 in green. Such displaying in a different color for each component allows a user to recognize respective components, based on the difference in color. In another example, that of a spectral map displayed in a gray scale, areas corresponding to respective components may be displayed in gray with different shades corresponding to the respective components.

Figure 12:
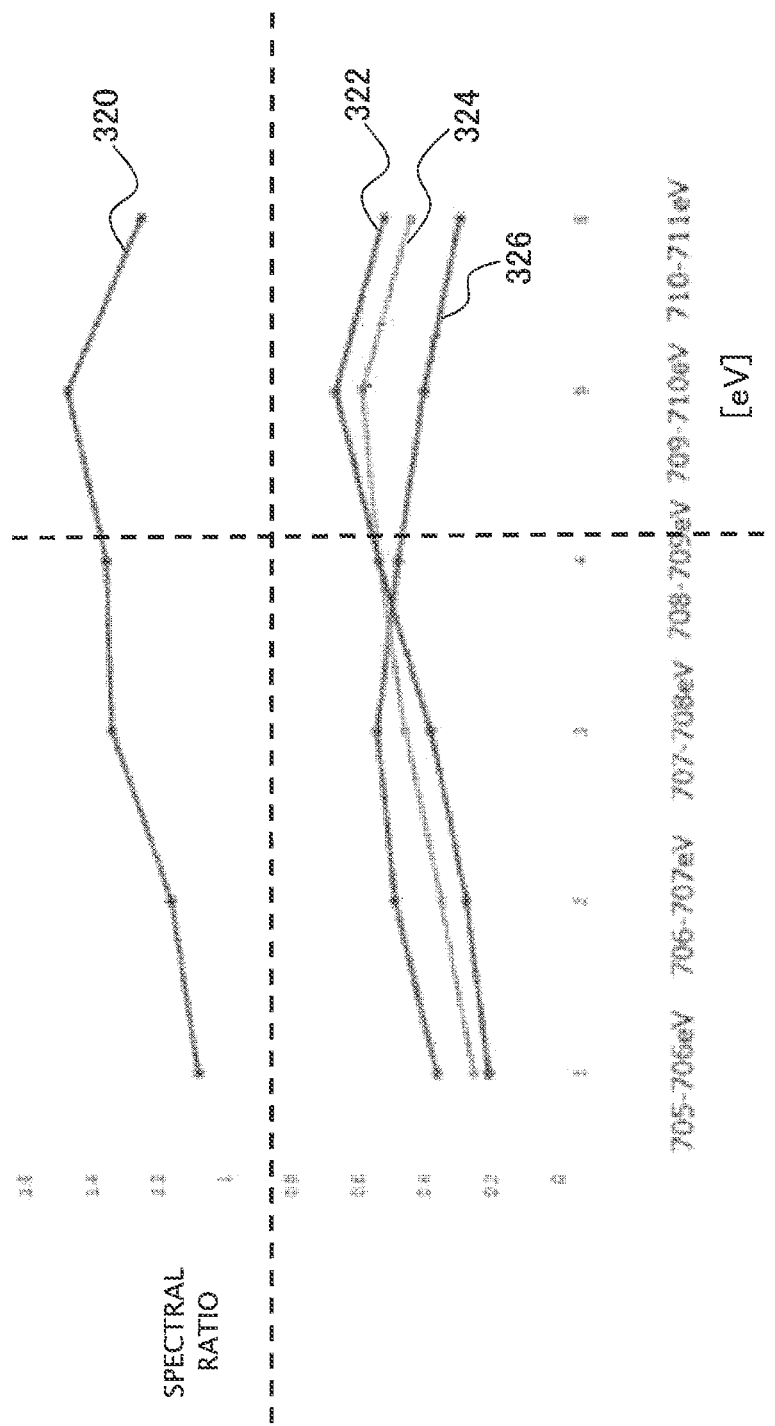
FIG. 12 is a graph showing the values of the spectral ratios A/B of respective components.

FIG. 12 illustrates a spectral ratio A/B for each component of the sample 100. Specifically, FIG. 12 is a graph showing the values of the spectral ratios A/B of respective components, in which the abscissa represents the energy, and the ordinate represents the spectral ratio.

Specifically, the display processor 74 extracts the value of a spectral ratio A/B for each energy at a position in an area made of Fe·Si metal components (for example, any position in the area) of the sample 100, from the spectral ratio A/B calculated by the calculation unit 72, and then plots the extracted value of the spectral ratio A/B for each energy. For example, the display processor 74 extracts the value of a spectral ratio A/B for each energy ROI, and plots the extracted values. In an example here, the range of energy is from 705 to 711 eV, and the width of an energy ROI is 1 eV. The display processor 74 extracts the value of a spectral ratio A/B for every 1 eV within the range from 705 to 711 eV, and plots the extracted values of the spectral ratios A/B. The waveform 320 is obtained with the plotting, and shows change in spectral ratio A/B relative to the energy, with respect to Fe·Si metal.

With respect to each of Fe2SiO4, Fe2O3, and Fe3O4 as well, the value of a spectral ratio A/B for every 1 eV is plotted, similar to a Fe·Si metal, to generate a waveform.

The waveform 322 shows change in a spectral ratio A/B relative to energy with respect to Fe2O3. The waveform 324 shows change in a spectral ratio A/B relative to energy with respect to Fe3O4. The waveform 326 shows change in a spectral ratio A/B relative to energy with respect to Fe2SiO4.

Specifically, the waveform 322 is formed by extracting the value of a spectral ratio A/B for every 1 eV within the range from 705 to 711 eV at a position in an area composed of Fe2O3 (for example, any position in the area) and plotting the extracted values. This is similarly applied to the waveforms 324, 326.

Referring to the waveforms 320 to 326, it is known that the spectral ratios A/B of metals (for example, Fe·Si metal) are higher than those of oxides (for example, Fe2O3, Fe3O4, Fe2SiO4). That is, the spectral ratio A/B of metals tends to be relatively high, while the spectral ratio A/B of oxides tends to be relatively low.

With respect to Fe·Si metal, Fe2O3, and Fe3O4, the energy at which a peak of the spectral ratio A/B is measured (that is, energy corresponding to an absorption edge) is around 710 eV. With respect to Fe2SiO4, the energy at which a peak of the spectral ratio A/B is measured (that is, energy corresponding to an absorption edge) is around 708 eV. As described above, by displaying the spectral ratios A/B in a graph, it is possible to distinctly show the difference in energy corresponding to an absorption edge.

Comparison between the waveform 322 of Fe2O3 and the waveform 324 of Fe3O4 shows that the gradient of the waveform 322 of Fe2O3 approaching the peak is sharper than that of the waveform 324 of Fe3O4. This means that Fe2O3 is affected by absorption to a greater extent than Fe3O4.

As described above, a spectral map according to the embodiment enables observation of a fine absorption structure.

Although 2D spectral map is generated in the above-described embodiment, a spectral ratio A/B at one or more positions may be measured and displayed. Alternatively, a spectral ratio A/B at each position on a straight line or a curved line may be measured and displayed. Use of a point analysis or a line analysis can shorten a time necessary for analysis.

Although a sample 100 containing Fe is described in the above embodiment, a sample 100 containing an element other than Fe, such as Ni, Mn, Co, or the like, may be used for measurement. For example, valence modification of Ni, Mn, or Co due to charging and discharging may be observed, Ni, Mn, and Co being used for a positive electrode of a battery. An oxidation state of steels or non-ferrous materials may be observed.

Referring to FIG. 13 to FIG. 18, a result of measurement of a sample 100 containing manganese (Mn) will be described. FIG. 13 to FIG. 18 illustrate waveforms representing the spectral ratio A/B of Mn, in which the abscissa indicates the energy, and the ordinate indicates the spectral ratio.

In an example here, the first acceleration voltage, or a low acceleration voltage, is 2 kV, and the second acceleration voltage, or a high acceleration voltage, is 5 kV. A spectrum A is obtained using the first acceleration voltage of 2 kV, and a spectrum B is obtained using the second acceleration voltage of 5 kV. A spectral ratio A/B, that is, a ratio in intensity between the spectrum A and the spectrum B, is calculated, and a waveform representing the spectral ratio A/B is generated. The spectral ratio assigned to the ordinate corresponds to the spectral ratio A/B. A spectral ratio A/B in the energy band from 600 to 680 eV is generated here. It should be noted that the combination of a low acceleration voltage and a high acceleration voltage is not limited to 2 kV/5 kV, and may be arbitrarily changed depending on the kind of a sample to use or a depth in a sample (a depth from the surface of the sample) at which information (X-ray) is detected.

Figure 13:
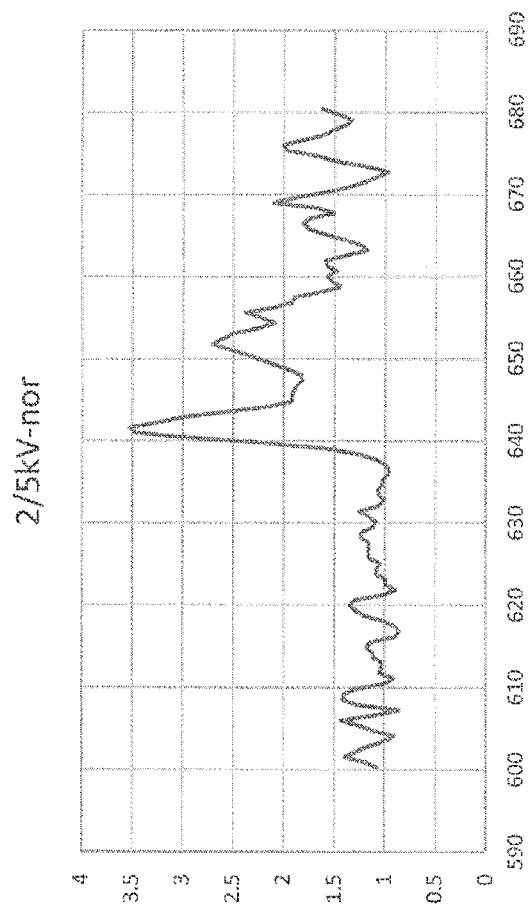
FIG. 13 illustrates a spectral ratio of a Mn simple substance.

FIG. 13 illustrates a spectral ratio waveform of an Mn simple substance. The energy corresponding to a peak of the spectral ratio A/B waveform is an energy reflecting an absorption edge, and the value of the energy is 641.62 eV or 652.445 eV, for example.

Figure 14:
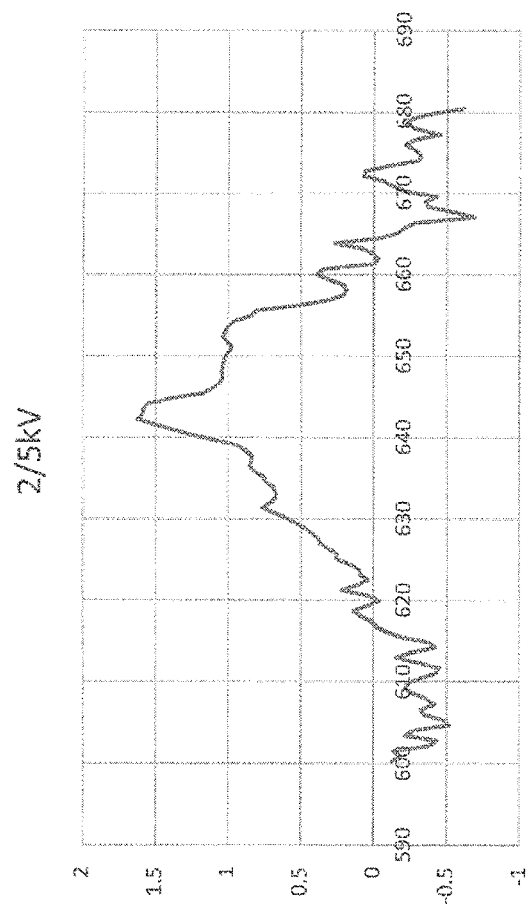
FIG. 14 illustrates a spectral ratio of MnO2.

FIG. 14 illustrates a spectral ratio waveform of MnO2. The value of energy corresponding to a peak of the waveform is 642.89 eV.

Figure 15:
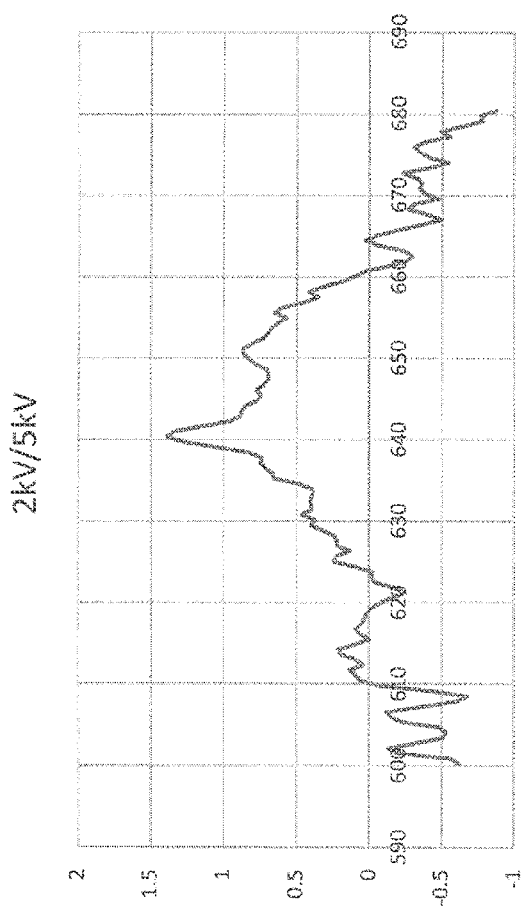
FIG. 15 illustrates a spectral ratio of Mn2SiO4.

FIG. 15 illustrates a spectral ratio waveform of Mn2SiO4. The value of energy corresponding to a peak of the waveform is 640.984 eV or 651.8 eV.

Figure 16:
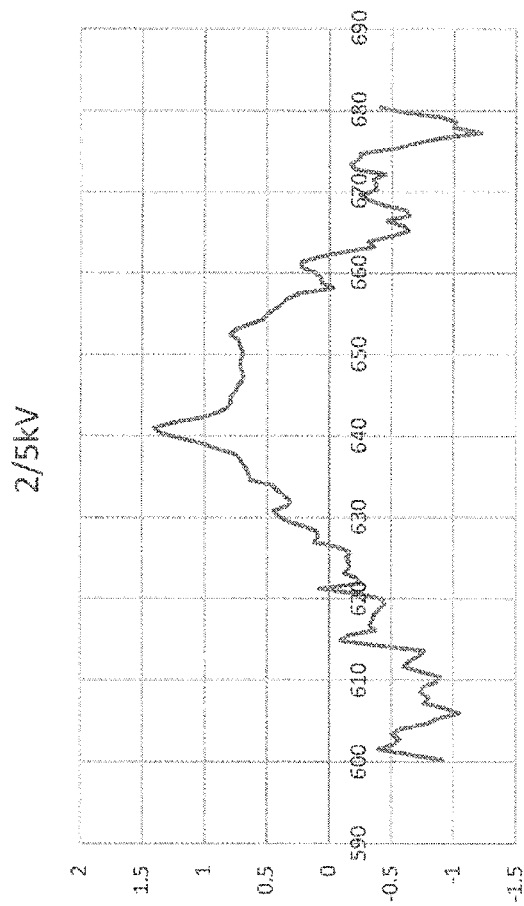
FIG. 16 illustrates a spectral ratio of MnCO3.

FIG. 16 illustrates a spectral ratio waveform of MnCO3. The value of energy value corresponding to a peak of the waveform is 640.34 eV.

Figure 17:
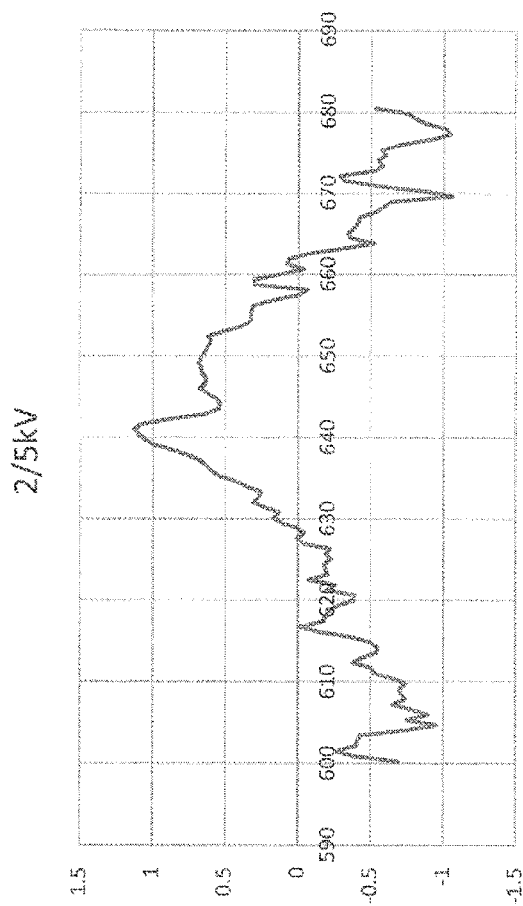
FIG. 17 illustrates a spectral ratio of (MnCa)3SiO9.

FIG. 17 illustrates a spectral ratio waveform of (MnCa) 3SiO9. The value of energy corresponding to a peak of the waveform is 641.62 eV.

Figure 18:
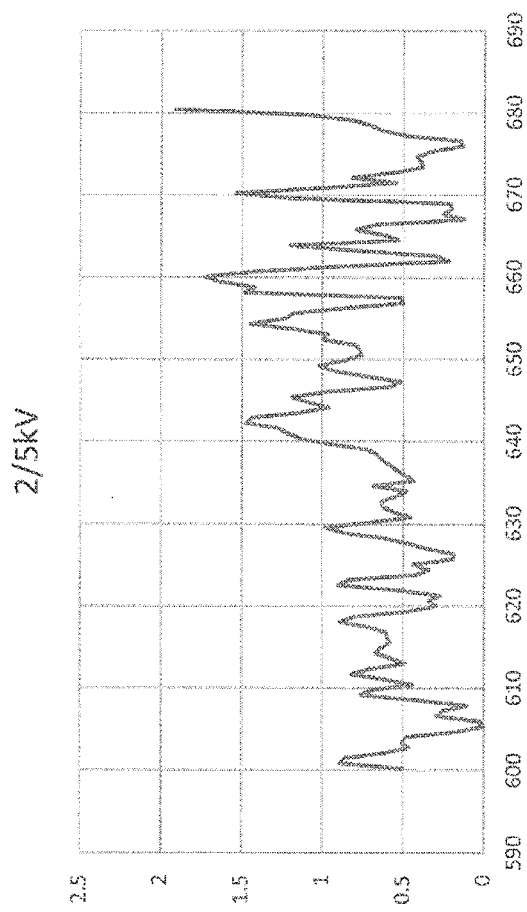
FIG. 18 illustrates a spectral ratio of (MnFe)2O3.

FIG. 18 illustrates a spectral ratio waveform of (MnFe) 2O3. The value of energy corresponding to a peak of the waveform is 642.89 eV or 660.89 eV.

An electron beam 24 accelerated using an acceleration voltage of 2 kV and an electron beam 24 accelerated using an acceleration voltage of 5 kV are separately applied to each of the positions on the sample 100, and a spectral ratio A/B in each of the positions on the sample 100 is calculated. Thereafter, as described referring to FIG. 9 and FIG. 10, the value of a spectral ratio A/B is extracted for each energy ROI from each of the spectral ratio waveforms. The extracted values of the spectral ratios A/B are mapped onto points corresponding to the respective positions on the sample 100. With the above, spectral maps showing spectral ratios A/B, similar to the spectral maps illustrated in FIG. 11, are generated.

The energy band that contains the value of energy corresponding to a peak of the spectral ratio A/B will differ according to the composition of the sample 100. For example, for a sample 100 containing Fe, an energy band containing the value of energy corresponding to a peak of the spectral ratio A/B is within the range from 680 to 740 eV, as illustrated in FIG. 6 and FIG. 7. For a sample 100 containing Mn, an energy band containing the value of energy corresponding to a peak of the spectral ratio A/B is in the range of 600 to 680 eV is, as illustrated in FIG. 13 to FIG. 18. Because the energy band containing the value of energy corresponding to a peak of the spectral ratio A/B differs between Fe and Mn as described above, the calculation unit 72 may calculate a spectral ratio A/B, while changing the energy band, depending on an element. Specifically, the calculation unit 72 calculates a spectral ratio A/B in the range from 680 to 740 eV with respect to a sample 100 containing Fe components, and the range from 600 to 680 eV with respect to a sample 100 containing Mn components.

In the above-described embodiment, it is possible to conduct wide-range observation of a 2D spatial distribution of an absorption edge structure of a sample using the scanning electron microscope 10, and without using a device employing a transmission electron microscope (TEM) or synchrotron radiation.

Because a TEM is not used, it is possible, for example, to conduct a wide-range observation of an absorption edge structure of a bulk sample. For example, it is possible to observe a 2D spatial distribution of an absorption edge structure of a bulk sample having a face size of up to 10 cm×10 cm. Further, as it is not necessary to employ a thing sample, an operator need not labor to thin out a sample. Further, unlike a device using synchrotron radiation, it is possible to conduct a wide-range observation of a 2D spatial distribution of an absorption edge structure of a sample without using a large device.

This embodiment can implement the following advantages. First, it is possible to analyze valence electronic information in a low energy band together with an X-ray spectrum that contributes to chemical bonding. It is possible to analyze a sample in the same field of view, while changing the acceleration voltage for an electron beam within a range from a few hundreds V to kV or the like, which enables accurate observation of the absorption effect of an X-ray for every tissue of the sample. Further, it is possible to obtain a ratio spectrum corresponding to an absorption edge or near an absorption edge so that a measurement result similar to that which will be obtained using synchrotron radiation can be obtained. The microscope can output a large-volume data so that large-volume data (for example, a few thousands or more data unit) can be stored for each pixel (for example, for every position to which the electron beam 24 is applied) on a spectral map.

The invention claimed is:

1. A scanning electron microscope, comprising:
 a detection device; and
 an information processing device comprising at least one processor configured to:
 apply individual electron beams to an area on a sample using two different acceleration voltages to obtain a spectrum of a soft X-ray in the area on the sample for each of the acceleration voltages;

calculate a spectral ratio of the spectra obtained through application of the electron beams of the two different acceleration voltages;

extract a value of a ratio in an energy region of interest corresponding to energy at an absorption edge of each element from the spectral ratio calculated to provide a plurality of extracted values;

generate a spectral map while changing a position of the energy region of interest by mapping the plurality of extracted values onto points corresponding to respective positions on the sample and adding color to the spectral map based on a magnitude of a value of the plurality of values; and display the spectral map via a display, wherein an energy band in which a peak of the spectral ratio is measured contains the value of an energy corresponding to the absorption edge.

2. The scanning electron microscope according to claim 1, wherein the at least one processor is further configured to:
store an energy value at an X-ray absorption edge of an element, wherein, when an energy band of the spectral ratio calculated contains a stored energy value, the at least one processor is configured to:
determine the energy value as the energy region of interest;
extract a ratio at the energy value as a ratio in the energy region of interest; and
display the ratio extracted as the spectral map via the display.

3. The scanning electron microscope according to claim 1, wherein the at least one processor is further configured to:
calculate the spectral ratio of the spectra while changing an energy band depending on the element.

4. The scanning electron microscope according to claim 2, wherein the at least one processor is further configured to:
calculate the spectral ratio of the spectra while changing the energy band depending on the element.

5. A method for displaying a map of an absorption edge structure, the method comprising:
applying, by at least one processor of a scanning electron microscope, individual electron beams to an area on a sample, using two different acceleration voltages, to obtain a spectrum of a soft X-ray in the area on the sample for each of the acceleration voltages;
calculating, by the at least one processor of the scanning electron microscope, a spectral ratio of the spectra obtained through application of the electron beams of the two different acceleration voltages;
extracting, by the at least one processor of the scanning electron microscope, a ratio in an energy region of interest corresponding to energy at an absorption edge of each element from the spectral ratio calculated;
generating, by the at least one processor of the scanning electron microscope, a spectral map while changing a position of the energy region of interest by mapping the plurality of extracted values onto points corresponding to respective positions on the sample and adding color to the spectral map based on a magnitude of a value of the plurality of values; and
displaying, by the at least one processor of the scanning electron microscope, the spectral map via a display of the scanning electron microscope, wherein an energy band in which a peak of the spectral ratio is measured contains the value of an energy corresponding to the absorption edge.

* * * * *

UNITED STATES PATENT AND TRADEMARK OFFICE
CERTIFICATE OF CORRECTION

| | | |
|---|---|---|
| PATENT NO. | : 12,429,442 B2 | Page 1 of 1 |
| APPLICATION NO. | : 17/941394 | |
| DATED | : September 30, 2025 | |
| INVENTOR(S) | : Hideyuki Takahashi et al. | |

It is certified that error appears in the above-identified patent and that said Letters Patent is hereby corrected as shown below:

On the Title Page

Column 1, (73) Assignee, Line 1, delete "JOEL" and insert -- JEOL --

Signed and Sealed this
Second Day of December, 2025

John A. Squires
*Director of the United States Patent and Trademark Office*